United States Patent [19]

Ratzel

[11] Patent Number: 5,355,086
[45] Date of Patent: Oct. 11, 1994

[54] METHOD FOR THE GENERATION OF AN NMR SPECTRUM WITHOUT SIDE-BANDS

[75] Inventor: Dieter Ratzel, Rheinstetten, Fed. Rep. of Germany

[73] Assignee: Bruker Medizintechnik GmbH, Rheinstetten, Fed. Rep. of Germany

[21] Appl. No.: 12,578

[22] Filed: Feb. 3, 1993

[30] Foreign Application Priority Data

Feb. 4, 1992 [DE] Fed. Rep. of Germany ....... 4203036

[51] Int. Cl.$^5$ .................................... G01R 33/20
[52] U.S. Cl. ................................... 324/309; 324/307
[58] Field of Search .................. 324/307, 309, 300; 128/653.2

[56] References Cited

U.S. PATENT DOCUMENTS

| 4,567,440 | 1/1986 | Haselgrove | 324/309 |
|---|---|---|---|
| 4,885,542 | 12/1989 | Yao et al. | 324/307 |
| 4,910,460 | 3/1990 | Sebok | 324/307 |
| 5,025,216 | 6/1991 | Pauly et al. | 324/307 |
| 5,162,730 | 11/1992 | Schmitt et al. | 324/309 |
| 5,227,725 | 7/1993 | Cory et al. | 324/309 |
| 5,248,942 | 9/1993 | Ratzel et al. | 324/309 |
| 5,262,723 | 11/1993 | Hurd et al. | 324/309 |

FOREIGN PATENT DOCUMENTS

| 3209263 | 8/1982 | Fed. Rep. of Germany | G01N 24/08 |
|---|---|---|---|
| 3434161 | 9/1984 | Fed. Rep. of Germany | G01N 24/08 |
| 1584949 | 2/1981 | United Kingdom . | |

OTHER PUBLICATIONS

NMR für Mediziner und Biologen, by K. H. Hausseer and H. R. Kalbitzer, Springer-Verlag, Berlin, 1989, p. 148ff.

*Primary Examiner*—Kenneth A. Wieder
*Assistant Examiner*—Raymond Y. Mah
*Attorney, Agent, or Firm*—Cesari and McKenna

[57] ABSTRACT

In a method for the generation of a nuclear magnetic resonance (NMR) spectrum from a measuring volume, which is exposed to a highly homogeneous stationary magnetic field $B_0$, a radio frequency (RF)-pulse is irradiated in a first run into the measuring volume in order to excite the concerned nuclear spins; at least one magnetic gradient field G is switched, for example for selecting a certain slice from the measuring volume and after switching off the magnetic gradient field G, a first data set is recorded which contains the observable measuring signals from the measuring volume, subsequently the method is repeated in a second run with a magnetic gradient field $-G$ which has the opposite polarity to the magnetic gradient field G, whereas the remaining experimental parameters of the first run are maintained, wherein after switching off the magnetic gradient field $-G$ a second data set is recorded and added to the first data set. In this manner, side bands in NMR spectra and artifacts in NMR-images, respectively, can be compensated, which are caused by disturbances of the magnetic field $B_0$ owing to the switching of the gradient field G.

13 Claims, 2 Drawing Sheets

1

METHOD FOR THE GENERATION OF AN NMR SPECTRUM WITHOUT SIDE-BANDS

BACKGROUND OF THE INVENTION

The invention relates to a method for the generation of a nuclear magnetic resonance (NMR)-spectrum from a measuring volume which is exposed to a highly homogeneous stationary magnetic field $B_0$, wherein in a first run a radio frequency (RF)-pulse is irradiated into the measuring volume in order to excite the concerned nuclear spins, at least one magnetic gradient field G, for example for the selection of a certain slice from the measuring volume, is switched and after switching off the magnetic gradient field G a first data set is recorded which contains the observable measuring signals from the measuring volume.

A method of this type is known for example from DE-OS 32 09 263. It describes a method for the limitation of highly-resolved NMR spectrometry onto a selected area of a body, in which the area is prepared in that after the generation of a homogeneous magnetic field $B_0$, magnetic gradient fields are superimposed the strengths of which vary in a linear manner in one spatial direction in each case, and subsequently the selected nuclear spins are selectively excited by means of corresponding RF-excitation pulses in a certain layer and respectively only in one certain volume element of the measuring volume. By this means a slice- or volume-selective spectrum can be recorded from the concerned measuring volume.

Owing to the fast switching of the magnetic gradient fields, correspondingly fast magnetic field variations are generated which lead on the one hand to forces acting upon the gradient coil because of the occurring Lorentz-forces and finally to mechanical vibrations of the gradient coil as well as of the construction parts of the NMR apparatus surrounding the measuring volume, and on the other hand also generate eddy currents in the surrounding conductive structures which themselves contribute to the magnetic field in the measuring volume. The eddy currents generated by the changes in the magnetic field which occur when switching the gradient fields, show in the beginning the same symmetry as the switched gradient fields so that, in the case of a completely symmetrical conductive environment, they should not contribute to the stationary magnetic field $B_0$ owing to the total antisymmetry of the gradient fields with respect to the center of symmetry. Since, however, the conductive structures comprise normally of unsymmetries, finally also the stationary magnetic field $B_0$ is impaired by the magnetic fields generated by the eddy currents.

The conductive structures, as for example copper pipes, radiation shields, electrical shields and the like, which are put into vibration by the acting forces described above owing to the gradient field switching, act in the stationary magnetic field $B_0$, which is very strong for NMR applications, as generators which generate oscillating currents and thus oscillating magnetic fields, in particular oscillating contributions to the stationary magnetic field $B_0$. Thus, the momentary value of the stationary magnetic field $B_0$ is modulated.

As a result these disturbances of the homogeneous stationary magnetic field $B_0$ cause so-called side bands in the recorded NMR spectrum and respectively artifacts in an NMR image composed thereof which can be attributed to side bands.

SUMMARY OF THE INVENTION

It is thus an object of the present invention to introduce a method for the generation of an NMR spectrum, wherein the so-called artifacts owing to side bands disappear as completely as possible.

This object is achieved according to the invention in that the method is repeated in a second run with a magnetic gradient field $-G$ which has a polarity which is opposite to the one of the magnetic gradient field G, while the other experimental parameters of the first run are maintained, wherein after switching off the magnetic gradient field $-G$ a second data set is recorded and combined with the first data set.

Although the causes for the success of this method are not yet researched into the last detail, it is to be assumed that in the second measuring run with oppositely poled magnetic gradient field $-G$ at least over some time a condition is achieved in which the vibrations of the basic magnetic field $B_0$ are phase-shifted by almost exactly 180° with respect to the oscillations of the magnetic field $B_0$ in the first run. If thus the first and the second data sets are added, the artifacts owing to the oscillations of the basic magnetic field $B_0$ just vanish, whereas the "useful" measuring signals double. In this way an NMR spectrum without side bands and respectively an NMR image free of artifacts can be generated with very simple means.

In the fields of NMR spectroscopy and NMR imaging, methods have been known for a long time in which seemingly features of the method according to the invention are used, however, this is done in a completely different connection, for completely different purposes and with other results so that the object of the invention set herein could not be achieved before by this means. In the book "NMR für Mediziner und Biologen" by K. H. HAUSSER and H. R. KALBITZER, Springer Verlag, Berlin, 1989, p. 148 ff. for example phase encoding gradients are described which are switched gradually in n different measuring runs with amplitudes varying in a linear equidistant manner. Since the phase encoding gradients change polarity in this method after the zero-crossing of the amplitude, there are n/2 pairs of measuring runs in which one phase encoding gradient in each case with the same amplitude, but with opposite polarity is switched. However, the pairs of measuring signals recorded for these "inverted" pairs of phase encoding gradients are not added like in the case of the method according to the invention, but are evaluated separately. Adding the corresponding signal pairs would destroy the information from phase encoding.

At the same place in the above-mentioned book also the switching of rephasing gradients is described which follow directly the switching of a slice gradient in each case and of which the polarity is inverted with respect to the slice gradient. This gradient switching also has nothing to do with the method according to the invention, since on the one hand the rephasing gradient is not inversely equal to the corresponding slice gradient and on the other hand not separate signal recordings are performed after the switching of the two gradients but only one common signal is recorded for both gradients such that also the addition of a second data set to a first data set as according to the invention is not realized.

In addition to the two mentioned methods there are further methods according to the prior art wherein magnetic gradient fields are successively switched with inverted polarity, however, hitherto no single method is known in which, in two successive measuring runs, the polarity of a magnetic gradient field G which is switched in the first measuring run is exactly reversed in the second measuring run, keeping the remaining parameters of the experiment constant, such that after addition of the two associated measuring signals the side bands in the associated spectrum and artifacts in the NMR-image, respectively, which are caused by the switching of the gradients, are eliminated.

In the case of a simple embodiment of the method according to the invention the combination of the second data set with the first data set is performed by direct addition. According to a preferred embodiment the combination of the two data sets is performed by addition of the Fourier transforms of the two data sets.

In the case of a particularly preferred embodiment, disturbances and distortions of the magnetic field $B_0$ are compensated additionally in that either the size of the static magnetic field $B_0$ is changed in a suitable manner between the first 90°-RF-pulse and the following 180°-RF-pulse of a spin echo pulse sequence or in that the delay between the first 90°-RF-pulse and the following 180°-RF-pulse is adjusted to a value which is different from half the delay between the following 180°-RF-pulses of the spin echo pulse sequence such that the rephasing conditions which are necessary for the generation of spin echo pulse sequences are produced as described in detail in DE-OS 37 30 148.

In the case of a further embodiment several magnetic gradient fields $G_1, G_2, \ldots G_k \ldots$ are switched in the first run and in the second run at least one gradient field, preferably the gradient field $-G_k$ which is switched as the last before the data recording, has the opposite polarity to the corresponding magnetic gradient field $G_k$ of the first run. The disturbances owing to the gradient switching, described above, decrease with time with exponential attenuation such that in particular the last gradient switch contributes the most to the disturbances of the basic magnetic field $B_0$ during the recording of the measuring signal.

The compensation of disturbances is even better in an embodiment in which in the second run all magnetic gradient fields $-G_k$ have the opposite polarity with respect to the corresponding magnetic gradient fields $G_k$ of the first run.

In the case of a preferred embodiment of the method, according to the invention, for spectroscopic applications, there is no magnetic gradient field in the measuring volume in each case during the recording of data sets.

In a further preferred embodiment the recording of data sets starts in each case shortly, preferably within 10 ms, in particular within 1 ms after switching off the at least one magnetic gradient field G and respectively $-G$ of a measuring run. Particularly advantageous in this connection is an embodiment in which the recording of the data sets starts shortly after switching off the last magnetic gradient field of a run in each case.

A main case of application of the method according to the invention is the slice-specific and respectively volume-specific spectroscopy in which, according to the invention, the frequency $\omega_1$ of the RF-pulse irradiated in the first run is selected such that in connection with the at least one magnetic gradient field G, the selective excitation of nuclear spins in a certain slice in the measuring volume is effected and that the frequency $\omega_2$ of the RF-pulse irradiated in the second run is selected such that the frequencies $\omega_1$ and $\omega_2$ are symmetrical with respect to the resonance frequency $\omega_0$ of the nuclear spins in the undisturbed homogeneous magnetic field $B_0$.

In particular, for volume-specific spectroscopy in the case of an embodiment in each run at least three magnetic gradient fields $G_z, G_y, G_x$ and $-G_z, -G_y, -G_x$, respectively, are switched which, in connection with correspondingly selected frequencies of the respective RF-pulses, lead to a selective excitation of the nuclear spins in a certain volume element of the measuring volume.

The method according to the invention can be used in a particularly advantageous manner in cases in which a relatively small "useful signal" is recorded together with the signals of non-interesting nuclear spins which are very large with respect to the first, such that the amplitudes of the side bands of the non-interesting signals would cover the small "useful signal". In the case of a particularly advantageous embodiment thus the nuclear spin resonance signals of non-interesting materials, as for example solvents, embedding materials, etc. can be suppressed.

BRIEF DESCRIPTION OF THE DRAWINGS

In the following the invention is described and explained in more detail with reference to the embodiments shown in the drawing. The features which can be derived from the description and from the drawing can be applied in other embodiments of the invention individually or in groups in any combination with one another. In the drawing.

DETAILED DESCRIPTION OF A PREFERRED EMBODIMENT

For the generation of nuclear spin resonance (NMR)-spectra or (NMR)-images, a measuring volume is exposed to a highly homogeneous stationary magnetic field $B_0$ of which the field lines extend in parallel to the direction of a Z-axis. Under the influence of the homogeneous magnetic field $B_0$ the nuclear spins of the test substance align within the measuring volume in the direction of the Z-axis, if the magnetic field is sufficiently strong.

Figure 1A:
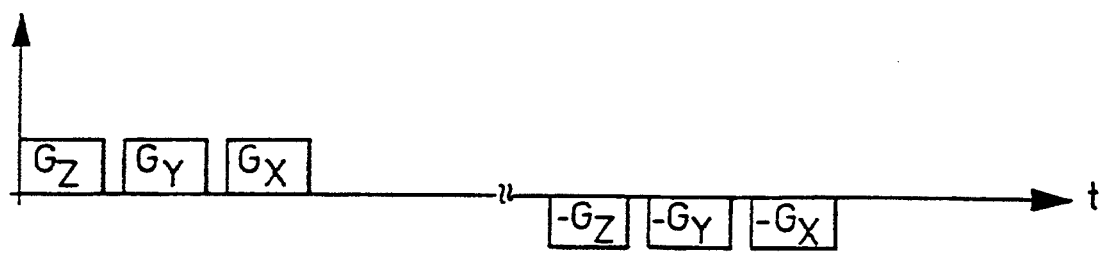
FIGS. 1a-c show a diagrammatic presentation of a time diagram of the signals used for carrying out the method according to the invention for recording a volume-selective NMR-spectrometer.
Figure 1B:
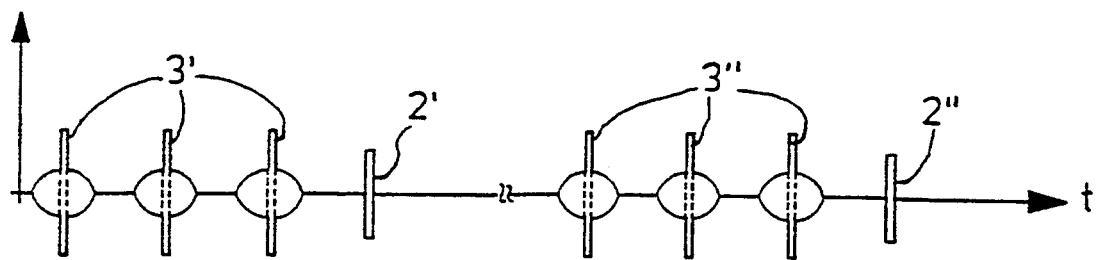
Figure 1C:
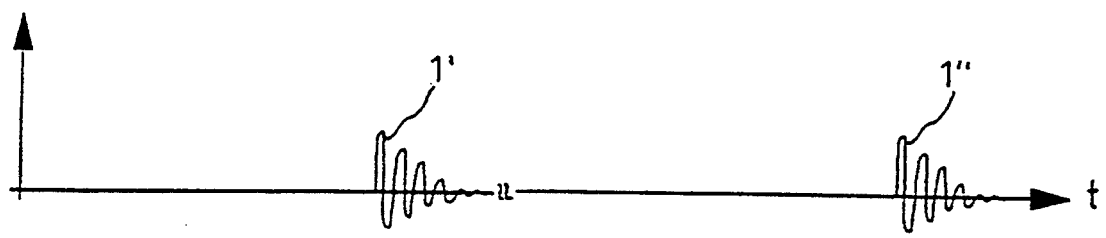

In order to obtain the measuring signals 1', 1" shown in FIG. 1c owing to the free induction decay (FID), the concerned nuclear spins have to be excited by means of the radio frequency (RF) pulses 2', 2", shown in FIG. 1b.

The excitation of the actual measuring signals 1', 1" in the method for volume-selective NMR-spectroscopy shown in FIG. 1, is preceded by a preparation phase in which the possible excitation of nuclear spins in the measuring volume is limited to a certain volume element by means of suitable switching of gradient fields G and $-G$, respectively, as well as by radiation of suitable RF-signals 3', 3"

The measuring signal 1' in FIG. 1c is recorded after the first run shown on the lefthand half of the figure and is stored in a first data set. Owing to the gradient fields $G_z$, $G_y$, $G_x$ which are switched before the recording of the measuring signal, disturbances in the vicinity of the measuring volume have been generated which have a negative effect on the quality of the NMR spectrum obtained by the measuring signals.

Owing to the fast switching of gradient fields and the fast magnetic field changes connected thereto, on the one hand forces are exerted on the construction parts of the NMR-apparatus which surround the measuring volume, the forces leading to mechanical vibrations which are conveyed to other parts of the NMR-apparatus in the form of solid-borne sound. These vibrating conductive structures, for example copper pipes, shielding plates or radiation shields in the normally used cryostat systems or also conductive components of an RF-resonator act in a strong stationary magnetic field $B_0$ as generators which generate oscillating currents and thus also time-variant magnetic fields which procure oscillating contributions to the stationary magnetic field $B_0$.

Furthermore, the fast magnetic field changes owing to the gradient switch cause eddy currents in the conductive structures surrounding the measuring volume owing to the gradient switch, which on their part generate time-variant magnetic fields which render in particular oscillating contributions to the stationary magnetic field $B_0$.

Figure 2:
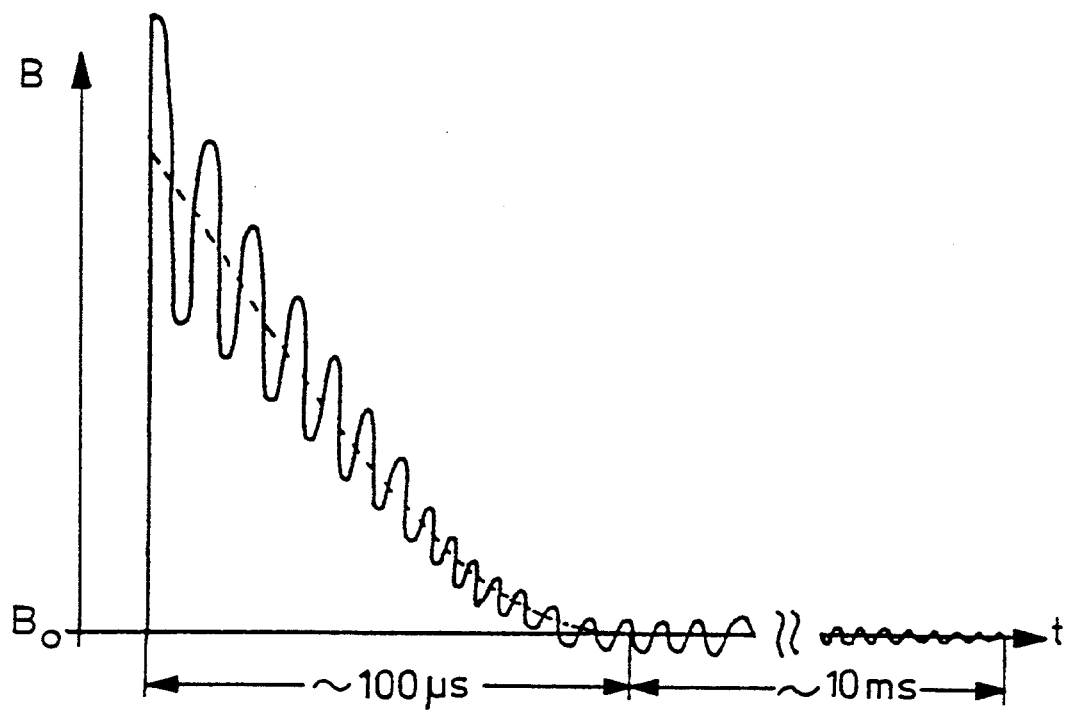
FIG. 2 shows in a diagrammatic manner the time course of an oscillating disturbance of the homogeneous magnetic field $B_0$ caused by a gradient switch.

FIG. 2 shows a typical course in time of such oscillating $B_0$ disturbances. In a first phase of approximately 100 $\mu$s a strong disturbance amplitude is observed, wherein the disturbance of the $B_0$-field goes back to zero in an exponential manner within approximately 100 $\mu$s. This strong, however, quickly diminishing disturbance is superimposed by a further long-lasting disturbance which oscillates with time and is damped down to zero only in the following 10 ms such that the undisturbed homogeneous magnetic field $B_0$ is then present again.

Figure 3:
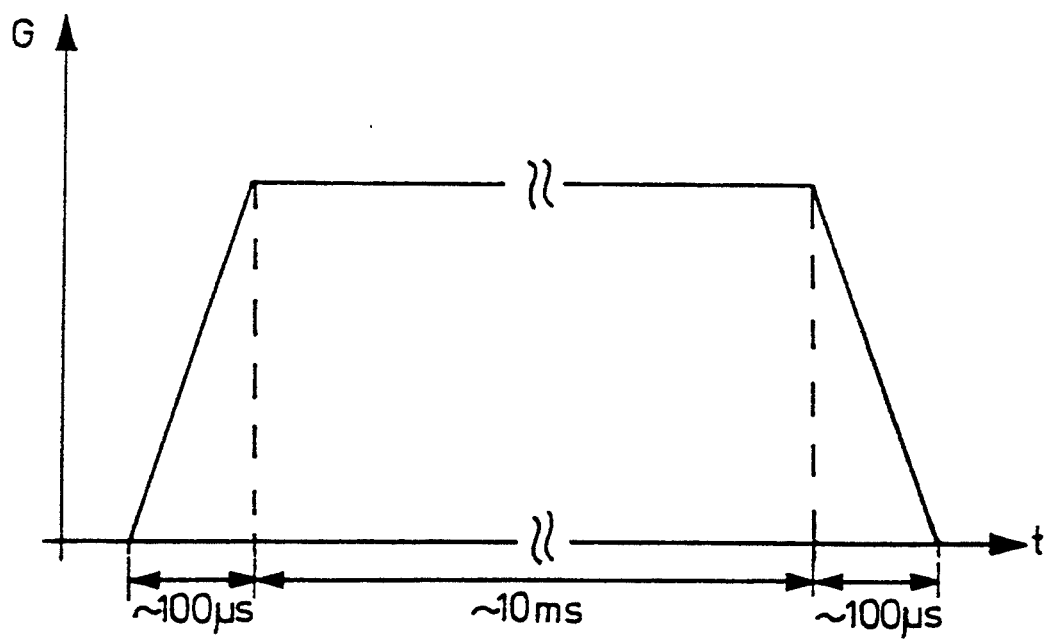
FIG. 3 shows the diagrammatic time course of a gradient switch.

FIG. 3 shows the typical dynamics of the switching of a gradient field G, wherein the rising and descending flanks extend in each case over approximately 100 $\mu$s, whereas the full gradient is applied over a time duration of the order of 10 ms. A comparison with the dynamics of the $B_0$-disturbances shown in FIG. 2 suggests that the large disturbances of the first phase which lasts for approximately 100 $\mu$s are caused by the eddy currents which are generated during the switching flanks of the gradient field G, whereas the superimposed oscillating disturbances which have smaller amplitudes but last for approximately 10 ms, are probably due to the mechanical vibrations of the construction parts which surround the measuring volume owing to the forces of the gradient switching.

In the end the modulations of the $B_0$-field lead to disturbances in the recorded NMR-spectrum, in particular to so-called side bands which seem to indicate on both sides the presence of further signals in addition to the actual NMR measuring signals. These disturbances have a particularly negative effect in those cases in which the "useful signal" is already relatively small with respect to nuclear magnetic resonance signals of non-interesting surrounding materials of a measuring sample, as it is the case with substances for example which are solved in solvents, in which case the solvent signal dominates considerably already owing to the considerably higher concentration of the solvent with respect to the solved agent. The side bands of such a solvent signal may in these circumstances completely "cover" the small "useful signal".

In order to remove the disturbing artifacts from the spectrum the second measuring run as shown in FIG. 1 on the righthand side is suggested, in which the switched gradient fields are inversely poled with respect to the first measuring run. In the shown example these are the gradient fields $-G_z$, $-G_y$, $-G_x$, wherein also the corresponding slice-selective RF-pulses 3'' have to be selected such that by means of the inverted gradient fields still the same volume element as in the first run is selected. This is controlled normally by the frequency $\omega$ of the corresponding RF-pulse 3' and 3'', respectively.

Instead of inverting several magnetic gradient fields G in the second run, it is also possible to switch only the last gradient field, i.e. in the example of FIG. 1 to switch $G_x$ in the second run with opposed polarity. Since the main disturbances have died out already after approximately 100 $\mu$s owing to the switching of the gradient fields $G_z$, $G_y$, which precede in terms of time, as indicated in FIG. 2, whereas the oscillating disturbances of the $B_0$-field which are in the order of 10 ms and are probably caused by mechanical vibrations of the structures surrounding the measuring volume, are applied on the system essentially by the switching of the last gradient in time, an inversion of the gradients preceding the last switched gradient is not absolutely necessary in the second run.

The recording of the data sets in the case of NMR-spectroscopic methods starts normally approximately 1 to 10 ms after switching the last magnetic gradient field G and $-G$, respectively, of one run, such that the "strong" disturbance of the $B_0$-field which has a duration in the order of only 100 $\mu$s has no more influence on the measured signals but only the oscillating part which has a duration of approximately 10 ms. By adding the data sets obtained in the first run and second run, in which at least the oscillating disturbing part is modulated in exactly the inverse manner owing to the inverted gradient switching of the $B_0$-field, the artifacts owing to the $B_0$ disturbances can be eliminated such that a side band-free NMR spectrum is obtained.

In the same manner also in other areas of the NMR measuring technology artifacts owing to $B_0$-field disturbances which are caused by gradient switching can be avoided or at least be reduced to a large degree, for example in the case of imaging methods in which the recording of data is performed shortly after switching off a gradient.

The sequence described in claim 1 is usually only one unit of a comprehensive measuring sequence. It may be integrated in pulse sequences, known from the art, for the volume-selective E spectroscopy or for NMR imaging or may be combined with such pulse sequences. The sequence may also be simply repeated n times in order to improve the signal-to-noise ratio which is necessary in particular in the case of weak E signals. In that case it also does not extend the entire measuring time.

Furthermore, the combination of the data sets of the first and the second measuring run may occur by direct addition of the data sets before a Fourier transformation or by adding data sets which are already Fourier-transformed.

In a preferred manner the above-described method is combined with a compensation, known per se, of the stationary magnetic field $B_0$ for the generation of the rephasing conditions which are necessary for spin echo pulse sequences.

I claim:

1. A method for the generation of a nuclear magnetic resonance (NMR) spectrum from a measuring volume comprising the steps of:
   exposing the measuring volume to a highly homogeneous stationary magnetic field $B_0$;
   irradiating, in a first run, a first radio frequency (RF)-pulse into the measuring volume to excite nuclear spins;
   switching on and off a first magnetic gradient field G;
   recording, in the absence of any magnetic gradient field, a first data set containing first observable measuring signals from the measuring volume;
   irradiating, in a second run, a second radio frequency (RF)-pulse, which is essentially the same as the first (RF)-pulse, into the measuring volume to excite nuclear spins;
   switching on and off a second magnetic gradient field $-G$ having a polarity opposite to that of the first magnetic gradient field;
   recording, in the absence of any magnetic gradient field, a second data set containing second observable measuring signals from the measuring volume; and
   adding the first data set to the second data set to generate a corrected data set, whereby the corrected data set is subsequently analyzed to produce a spectrum with suppressed eddy current sidebands.

2. The method of claim 1, further comprising Fourier-transforming the data sets wherein the addition of the second data set to the first data set is performed by addition of the Fourier-transformed data sets.

3. The method of claim 1, further comprising compensating for disturbances and distortions of the magnetic field $B_0$ by changing the size of the static magnetic field $B_0$ between the first RF-pulse and a subsequent 180° RF-pulse of a spin-echo pulse sequence.

4. The method of claim 1, further comprising compensating for disturbances and distortions of the magnetic field $B_0$ by adjusting a first delay between the first RF-pulse and a subsequent 180° RF-pulse of a spin-echo pulse sequence to a value which is different than half of a second delay between further 180° RF-pulses of the spin-echo pulse sequence.

5. The method of claim 1, wherein the first magnetic gradient field has a plurality of first gradient component fields and the second gradient field has a plurality of second gradient component fields corresponding to the first gradient component fields and wherein at least one second gradient component field has a polarity opposite to that of the corresponding first component gradient field.

6. The method of claim 5, wherein each second gradient component field has a polarity opposite to that of the corresponding first gradient component field.

7. The method of claim 1, wherein the recording of the first data set starts within 10 ms after switching off the first gradient magnetic field and the recording of the second data set starts within 10 ms after switching off the second gradient magnetic field.

8. The method of claim 5, wherein the recording of the first data set starts within 10 ms after switching off a last first gradient component field and the recording of the second data set starts within 10 ms after switching off a last second gradient component field.

9. The method of claim 1, wherein the first RF-pulse has a first frequency $\omega_1$ adapted, in conjunction with the first magnetic gradient field G, to selectively excite nuclear spins in a slice in the measuring volume and the second RF-pulse has a second frequency $\omega_2$ which is selected such that the frequencies $\omega_1$ and $\omega_2$ are symmetric with respect to an undisturbed resonance frequency $\omega_0$ of the nuclear spins in the homogeneous magnetic field $B_0$.

10. The method of claim 9, wherein the first gradient field has at least three first gradient component fields $G_x$, $G_y$, $G_z$ and the second gradient field has at least three second gradient component fields $-G_x$, $-G_y$, $-G_z$, the component fields being adapted for selective excitation of the nuclear spins in a certain volume element of the measuring volume.

11. The method of claim 1, further comprising suppressing non-interesting resonance signals from at least one of solvents and embedding material.

12. A method for the generation of a nuclear magnetic resonance (NMR) spectrum from a measuring volume comprising the steps of:
   exposing the measuring volume to a highly homogeneous stationary magnetic field $B_0$;
   irradiating, in a first run, a first radio frequency (RF)-pulse, with a first pulse frequency $\omega_1$, into the measuring volume to excite nuclear spins;
   switching on and off a first magnetic gradient field having at least three first gradient component fields $G_x$, $G_y$, $G_z$ with at least one first component field being adapted, in conjunction with the first pulse frequency, to selectively excite nuclear spins in a slice in the measuring volume;
   compensating for disturbances and distortions of the magnetic field $B_0$ by changing the size of the static magnetic field $B_0$ between the first RF-pulse and a subsequent 180° RF-pulse of a spin-echo pulse sequence;
   recording, in the absence of any magnetic gradient field and within 10 ms after switching off the first gradient field, a first data set containing first observable measuring signals from the measuring volume;
   irradiating, in a second run, a second radio frequency (RF)-pulse, which is essentially the same as the first RF-pulse and which has a second pulse frequency $\omega_2$, into the measuring volume to excite nuclear spins;
   switching on and off a second magnetic gradient field having at least three second gradient component fields $-G_x$, $-G_y$, $-G_z$ corresponding to the first gradient component fields with each second component field having a polarity opposite that of the corresponding first component gradient field and with at least one second gradient component field being adapted, in conjunction with the second pulse frequency, to permit selection of the first and the second pulse frequencies to be symmetric with respect to an undisturbed resonance frequency $\omega_0$ of the nuclear spins in the homogeneous magnetic field $B_0$ and with the first and the second gradient component fields being adapted for selective excitation of nuclear spins in a certain volume element of the measuring volume;
   suppressing non-interesting resonance signals from at least one of solvents and embedding material;
   recording, in the absence of any magnetic gradient field and within 10 ms after switching off the second gradient field, a second data set containing second observable measuring signals from the measuring volume;

Fourier-transforming the data sets; and adding the Fourier-transformed first data set to the Fourier-transformed second data set to generate a corrected data set, whereby the corrected data set is subsequently analyzed to produce a spectrum with suppressed eddy current side-bands.

13. A method for the generation of a nuclear magnetic resonance (NMR) spectrum from a measuring volume comprising the steps of:

exposing the measuring volume to a highly homogeneous stationary magnetic field $B_0$;

irradiating, in a first run, a first radio frequency (RF)-pulse, with a first pulse frequency $\omega_1$, into the measuring volume to excite nuclear spins;

switching on and off a first magnetic gradient field having at least three first gradient component fields $G_x$, $G_y$, $G_z$ with at least one first component field being adapted, in conjunction with the first pulse frequency, to selectively excite nuclear spins in a slice in the measuring volume;

compensating for disturbances and distortions of the magnetic field $B_0$ by adjusting a first delay between the first RF-pulse and a subsequent 180° RF-pulse of a spin-echo pulse sequence to a value which is different than half of a second delay between further 180° RF-pulses of the spin-echo pulse sequence;

recording, in the absence of any magnetic gradient field and within 10 ms after switching off the first gradient field, a first data set containing first observable measuring signals from the measuring volume;

irradiating, in a second run, a second radio frequency (RF) pulse, which is essentially the same as the first RF-pulse and which has a second pulse frequency $\omega_2$, into the measuring volume to excite nuclear spins;

switching on and off a second magnetic gradient field having at least three second gradient component fields $-G_x$, $-G_y$, $-G_z$ corresponding to the first gradient component fields with each second component field having a polarity opposite that of the corresponding first component gradient field and with at least one second gradient component field being adapted, in conjunction with the second pulse frequency, to permit selection of the first and the second pulse frequencies to be symmetric with respect to an undisturbed resonance frequency $\omega_0$ of the nuclear spins in the homogeneous magnetic field $B_0$ and with the first and the second gradient component fields being adapted for selective excitation of nuclear spins in a certain volume element of the measuring volume;

suppressing non-interesting resonance signals from at least one of solvents and embedding material;

recording, in the absence of any magnetic gradient field and within 10 ms after switching off the second gradient field, a second data set containing second observable measuring signals from the measuring volume;

Fourier-transforming the data sets; and adding the Fourier-transformed first data set to the Fourier-transformed second data set to generate a corrected data set, whereby the corrected data set is subsequently analyzed to produce a spectrum with suppressed eddy current side-bands.

* * * * *